United States Patent
Motz (10) Patent No.: US 6,674,322 B2
(45) Date of Patent: Jan. 6, 2004

(54) AMPLIFIER CIRCUIT WITH OFFSET COMPENSATION

(75) Inventor: Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 10/337,194

(22) Filed: Jan. 6, 2003

(65) Prior Publication Data

US 2003/0102909 A1 Jun. 5, 2003

Related U.S. Application Data (63) Continuation of application No. PCT/DE01/02438, filed on Jun. 29, 2001.

(30) Foreign Application Priority Data

Jul. 5, 2000 (DE) .......................................... 100 32 530

(51) Int. Cl.⁷ ................................................ H03F 1/02
(52) U.S. Cl. ............................... 330/9; 330/6; 327/124; 324/251
(58) Field of Search ................ 330/6, 9, 51; 327/124, 327/307, 551; 324/251, 225, 207.12, 207.2

(56) References Cited

U.S. PATENT DOCUMENTS

| | | | | |
|---|---|---|---|---|
| 3,516,002 A | * | 6/1970 | Hillis | ........................... 300/51 |
| 3,801,919 A | * | 4/1974 | Wilkes et al. | ................... 330/9 |
| 4,006,428 A | * | 2/1977 | Meyer et al. | .................. 330/51 |
| 5,406,202 A | | 4/1995 | Mehrgardt et al. | |
| 5,604,433 A | | 2/1997 | Theus et al. | |
| 5,621,319 A | | 4/1997 | Bilotti et al. | |

FOREIGN PATENT DOCUMENTS

| | | |
|---|---|---|
| DE | 42 18 533 C2 | 12/1992 |
| DE | 41 28 284 C2 | 3/1993 |
| GB | 2 019 146 A | 10/1979 |

OTHER PUBLICATIONS

Peter Jan Adriaan Munter: "Spinning–current method for offset reduction in silicon Hall plates", *Delft University Press*, 1992, pp. 12, 13, 112–117.

* cited by examiner

*Primary Examiner*—Henry Choe
(74) *Attorney, Agent, or Firm*—Laurence A. Greenberg; Werner H. Stemer; Ralph E. Locher (57) ABSTRACT

An amplifier circuit with offset compensation is particularly suited for a Hall element. In addition to the useful signal demodulation that is normally present and connected downstream of an amplifier, an error signal demodulator provides an error signal demodulation. The measured signals that are tapped off at the Hall sensor are coupled out at the input or output of the amplifier, and a demodulated error signal is fed back to the input of the amplifier. This makes it possible to reduce the drive range of the amplifier. The amplifier circuit is suitable in particular for Hall sensors that are operated in chopped mode.

11 Claims, 6 Drawing Sheets

AMPLIFIER CIRCUIT WITH OFFSET COMPENSATION

CROSS-REFERENCE TO RELATED APPLICATION

This application is a continuation of copending international application PCT/DE01/02438, filed Jun. 29, 2001, which designated the United States and which was not published in English.

BACKGROUND OF THE INVENTION

FIELD OF THE INVENTION

The invention relates to an amplifier circuit with offset compensation, in particular for magnetic field sensors operated in chopped mode.

Sensors, for example magnetic field sensors, usually need an offset error correction in order to operate precisely. In the case of integrated Hall elements operating as magnetic field sensors, an offset error can arise, for example, because of fabrication-induced bending of the silicon platelet (mechanical stress) or as a result of lithographic inaccuracies during the production process. Further offset errors can be caused by the external wiring of the Hall sensor, for example as a result of offset voltages in amplifiers connected downstream of the Hall sensor. U.S. Pat. No. 5,621,319 to Bilotti et al. specifies a method for compensating for the offset voltage normally occurring in Hall sensors. There, two pairs of terminals that are arranged orthogonally with respect to each other are provided on the Hall sensor. In each case one pair of terminals is fed with the excitation current and the Hall voltage is available on the other pair of terminals. A change between the pairs of terminals is made at the chopping cycle rate. In this way, the alternating voltage error signal is reduced.

A development of that chopped-Hall principle to a Hall sensor having N pairs of connecting terminals, which are interchanged cyclically—it is thereby possible for the Hall voltage to be picked off on one pair of terminals in each case which is arranged orthogonally with respect to the pair of terminals of the excitation current—is specified in the document "Spinning-Current Method for Offset Reduction in Silicon Hall Plates" by Peter Jahn Adriaan Munter, Delft University Press, 1992, page 12.

The common factor in the above-described offset compensation methods for magnetic field sensors is that in the amplifier connected downstream of the magnetic field sensor, both the useful signal and the chopped error signal have to be amplified considerably for further processing or demodulation. This requires high driveability of the amplifier stages, which stands in the way of the requirement for a lower and lower internal operating voltage. In order to suppress the alternating voltage error signal adequately, comprehensive circuit measures are required.

Furthermore, the above-described sampling of the useful signal then leads to an additional error when the useful signal changes. In the case of time-critical applications, this error signal additionally has to be filtered out of the useful signal.

Further disadvantages of the above-described offset compensation method reside firstly in the fact that, because of the offset-afflicted buffer amplifiers which are used in the sample-and-hold circuits, additional, undesired offsets are produced and, secondly, further offsets arise as the result of the use of summing resistors which have mismatches. Although these offsets are reduced in accordance with the chopped-Hall principle, they are not eliminated completely.

SUMMARY OF THE INVENTION

It is accordingly an object of the invention to provide an amplifier circuit with offset compensation which overcomes the above-mentioned disadvantages of the heretofore-known devices and methods of this general type and which is suitable for Hall sensors operated in chopped mode, requires a low drive range and needs little expenditure on filtering in order to suppress alternating voltage error signals.

With the foregoing and other objects in view there is provided, in accordance with the invention, an amplifier circuit with offset compensation, comprising:

a signal source for outputting a first measured signal in a first clock phase and a second measured signal in a second clock phase, each of the first and second measured signals having a useful component and, possibly, an offset component;

an amplifier having an input side connected to said signal source for receiving the measured signals and having an output side for carrying amplified measured signals;

an error signal demodulator connected to one of said input side and said output side of said amplifier for receiving the measured signals; and said error signal demodulator having an output connected to an input at said input side of said amplifier for supplying the offset component in antiphase.

In other words, the objects of the invention are achieved by an amplifier circuit with offset compensation as outlined. The amplifier circuit includes a signal source, on which a first measured signal can be tapped off in a first clock phase and a second measured signal can be tapped off in a second clock phase, the measured signals in each case having a useful component and possibly having an offset component. The circuit furthermore has an amplifier which, on the input side, is connected to the signal source for the supply of the measured signals and on whose output the amplified measured signals are provided. An error signal demodulator is connected to the input or output of the amplifier in order to supply the measured signals, and the demodulator has an output that is connected to an input of the amplifier in antiphase in order to supply the offset component.

According to the principle of the present invention, the offset component of the first and second measured signals is in each case coupled out of the measured signals by an error signal demodulator, the error signal is demodulated and then the demodulated error signal is fed back to the input of the amplifier. In this way, the error signal or the offset component of the measured signals is already eliminated at the amplifier input, so that the drive range of the amplifier only has to be matched to the useful component of the measured signals. Consequently, the drive range of the amplifier can be reduced considerably. The result is, therefore, a saving of chip area with higher accuracy of the circuit. In addition, the result overall is a lower delay time, caused only by the amplifier circuit. Furthermore, error signals which are caused by changing the useful signal are avoided as a result of avoiding sampling processing in the main signal branch.

After the amplifier circuit has been switched on, first of all both the useful component and the offset component of the measured signals and also amplifier offset signals are amplified in the amplifier. Even after a few clock cycles, the error signal antiphase coupling leads to the offset components being considerably reduced without falsifying the useful components.

In the antiphase coupling of the error signal, an integrator can be provided, by which means offsets are virtually completely eliminated.

Further advantages consist in the lower expenditure on filtering of the measuring signals, since the output ripple in measured signal ramps is reduced sharply. Since, for the further processing of the measured signals to be carried out on the output side of the amplifier, in particular of the useful component of the measured signals, a lower analog bandwidth is required, the noise characteristics of the amplifier circuit are improved. Finally, the aliasing errors are reduced in the amplifier circuit described, since no sampling-signal processing is carried out in the main signal path.

The signal source can be a magnetic field sensor.

In a preferred embodiment of the present invention, the measured signals are carried by using the differential path technique. In this way, common mode interference is suppressed.

In a further, advantageous embodiment of the present invention, a modulator which has means for reversing the polarity of the measured signal lines is arranged between magnetic field sensor and amplifier, and a demodulator which has means of reversing the polarity of the measured signal lines is arranged at the amplifier output. The means of reversing the polarity of the measured signal lines in the modulator and demodulator can be driven at a common chopping cycle rate.

If the signal source is a Hall sensor operated in chopped mode, the amplifier circuit can have 90° changeover switches for excitation current connections and signal outputs for the measured signals, which can be arranged in the modulator.

In accordance with a further, advantageous embodiment of the present invention, the error signal demodulator has a first low-pass filter and an amplifier connected downstream with a resistance on the output side. The amplifier can be a transconductance amplifier (OTA, operational transconductance amplifier). Instead of the low-pass filter, a summing junction or an integrator can be provided, in each case with an amplifier connected downstream.

In accordance with another feature of the invention, the amplifier can have a second low-pass filter connected downstream, which can be implemented with RC elements constructed in analog fashion. This makes it possible, in accordance with the principle of dynamic element interchange, to interchange the tolerance-afflicted resistors periodically, in order to compensate for their fabrication-induced tolerances.

The magnetic field sensor can have a Hall element. If the signal source is not a Hall element, the measured signals do not necessarily have to have an offset component. In this case, nevertheless, compensation is carried out, specifically the compensation of the offset of the (chopper) amplifier itself.

For chopping operation, the Hall element can have two orthogonal pairs of terminals, wherein in each case the excitation current is supplied to one pair of terminals and the Hall voltage, that is to say the first or second measured signal, can be tapped off at the other pair of terminals.

The error signal can be coupled out on the input side or output side of the amplifier.

The first low-pass filter in the error signal demodulator can of course be replaced by summing the signal voltages over the two clock phases or by averaging the voltages over the two clock phases. The first low-pass filter in the error signal demodulator can be replaced by an integrator.

Other features which are considered as characteristic for the invention are set forth in the appended claims.

Although the invention is illustrated and described herein as embodied in a amplifier circuit with offset compensation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
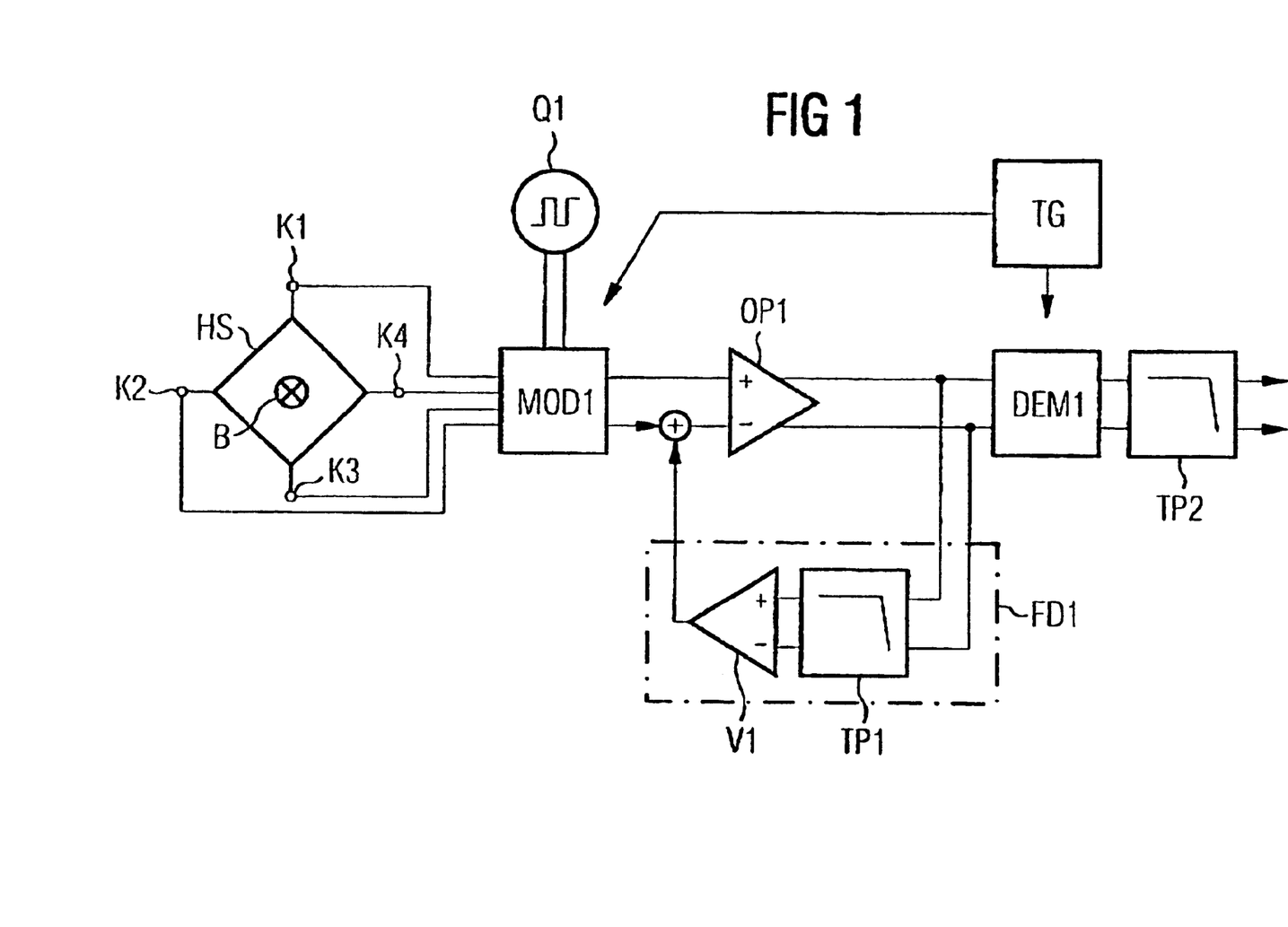
FIG. 1 is a block circuit diagram of a first exemplary embodiment of the amplifier circuit according to the invention.

Referring now to the figures of the drawing in detail and first, particularly, to FIG. 1 thereof, there is illustrated the present principle of an amplifier circuit with offset compensation. The circuit has an amplifier OP1 wit inputs connected to a Hall sensor HS. The Hall sensor HS is connected via a modulator MOD1 to the amplifier OP1 and also a current source Q1 for supplying an excitation current. The Hall element HS is penetrated by a magnetic field B. The Hall element HS has four. terminals K1 to K4, of which in each case two opposite terminals are connected to the excitation current source Q1 and two others to the inputs of the amplifier OP1. In the useful signal path, a first demodulator DEM1, which has means of reversing the polarity of the signal lines executed in the differential path technique for carrying the measured signals, is connected downstream of the operational amplifier OP1. The first modulator MOD1 and the first demodulator DEM1 are connected to a clock generator TG in order to supply a chopping cycle frequency. A second low-pass filter TP2 is connected downstream of the first demodulator DEM1. The second low-pass filter TP2 is used to filter peaks caused by changeover operations. Furthermore, an error signal demodulator FD1, which has a first low-pass filter TP1 with an amplifier V1 connected downstream, is connected to the output side of the amplifier OP1. The amplifier output from the amplifier V1 is connected to the inverting input of the operational amplifier OP1, forming a negative feedback loop. The amplifier V1 is a transconductance amplifier or a voltage amplifier with a resistor on the output side.

The modulator MOD1 is used to implement a periodic 90° changeover of pairs of terminals of the Hall sensor HS at the chopping cycle rate of the clock generator TG. The measured signals produced in this way, which have a useful signal component and an offset component, are supplied to the operational amplifier OP1 in the differential path technique and are amplified there. The offset component of the measured signals is coupled out from the measured signals by the first low-pass filter TP1 and, amplified, is fed back to the operational amplifier input. In this way, even after a few clock cycles, the offset component of the measured signals is reduced sharply. Consequently, the drive range of the operational amplifier OP1 can be reduced considerably as compared with conventional amplifiers operated in chopped mode. The subsequent filter complexity can be kept low, and delay times and noise can be reduced significantly.

Instead of the first low-pass filter TP1, integration elements, summing junctions or averagers can be provided.

Figure 2:
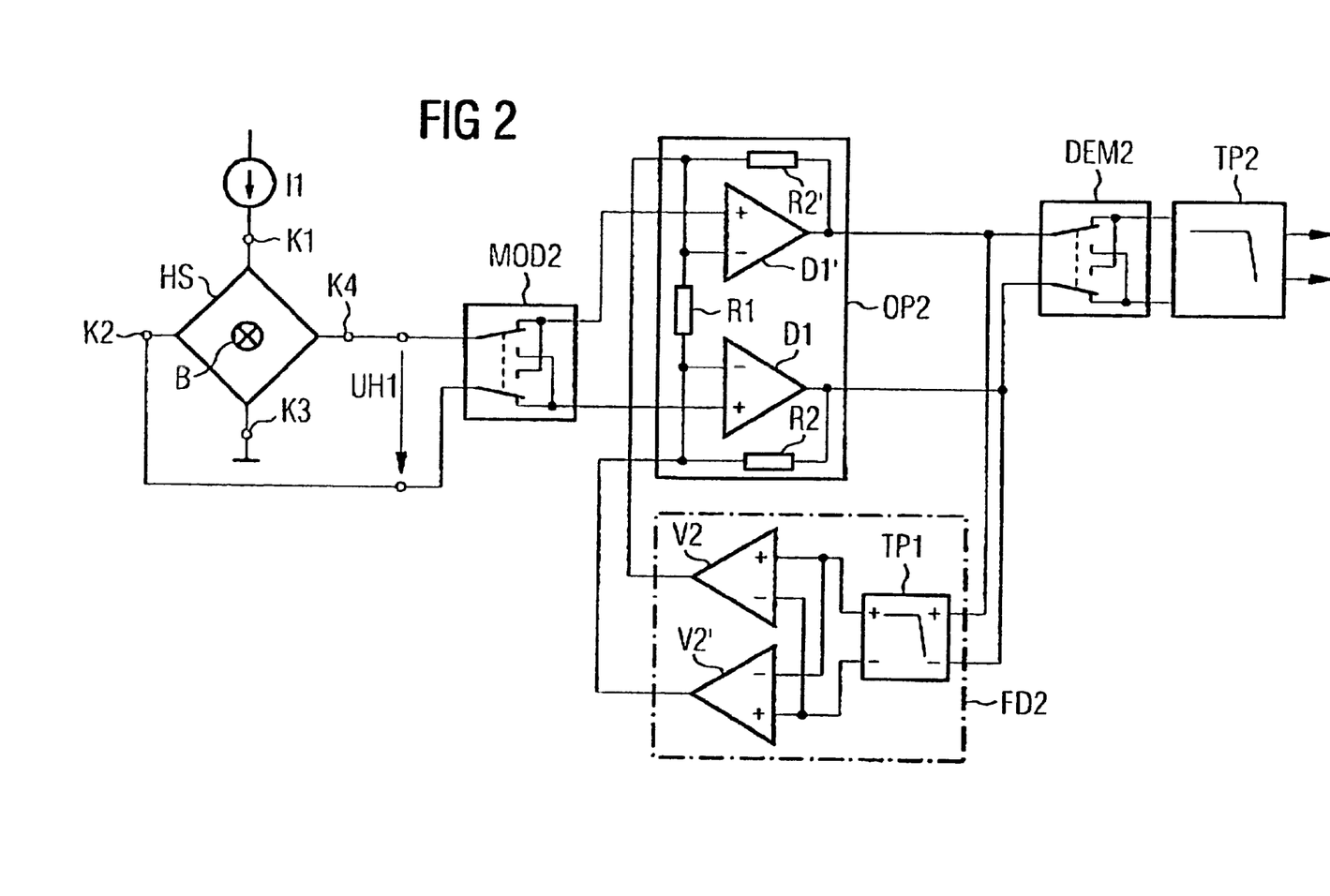
FIG. 2 is a block circuit diagram of a more detailed exemplary embodiment according to FIG. 1 in the first clock phase.
Figure 3:
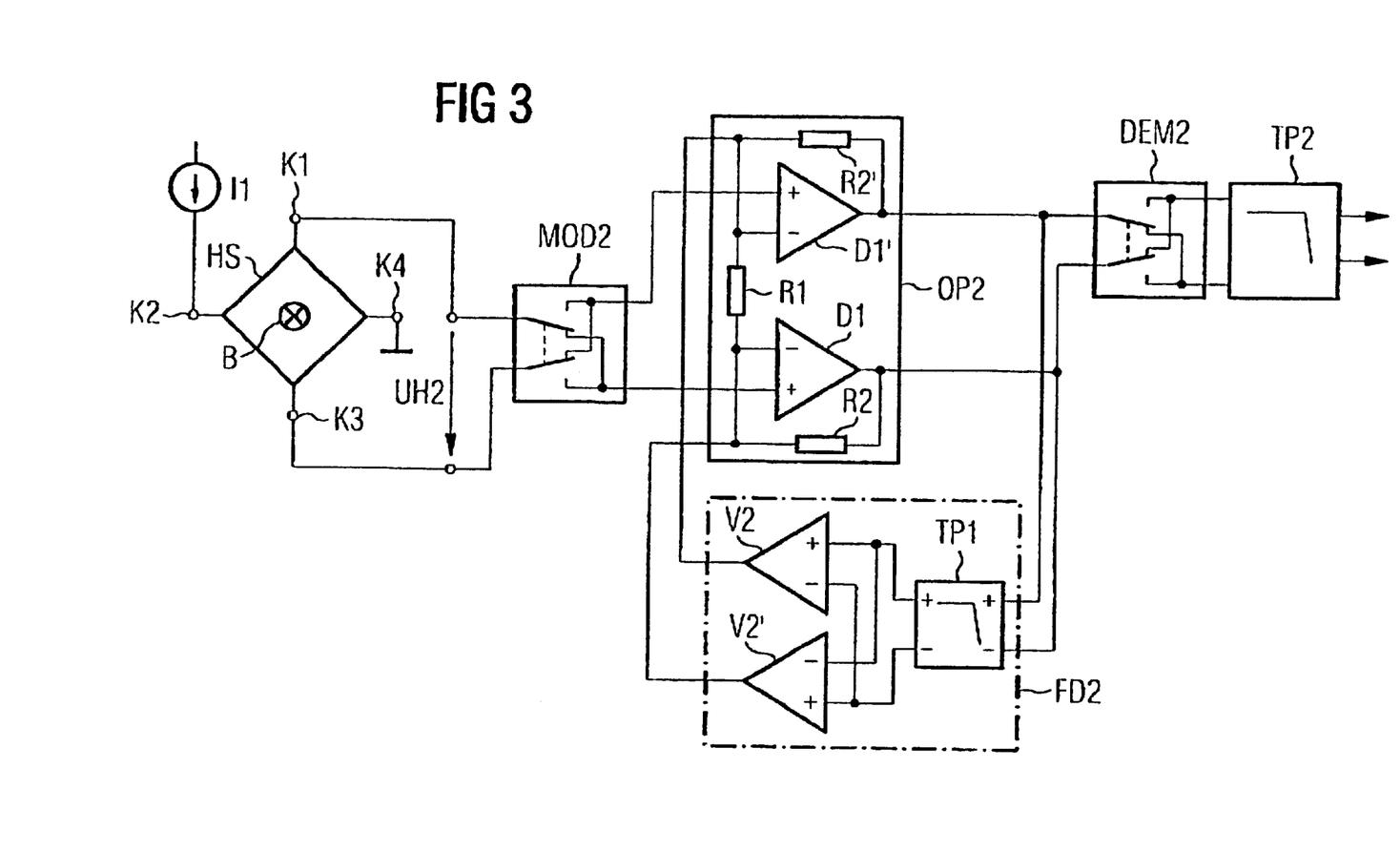
FIG. 3 is a block circuit diagram of the circuit according to FIG. 2 in the second clock phase.

FIG. 2 shows a development of the amplifier circuit according to FIG. 1 in the first clock phase, while the switching states of the circuit according to FIG. 2 during the second clock phase are illustrated in FIG. 3.

According to FIG. 2, an excitation current I1 is conducted through the Hall sensor via the terminals K1 and K3. The Hall voltage UH1 during the first clock phase (CLK1) can be tapped off at terminals K2 and K4. During the first clock phase, it is ensured that the measured signals are led through the modulator MOD2 and demodulator DEM2 without any polarity reversal. The operational amplifier OP2 according to FIG. 2 is designed as an instrumentation amplifier. That means, it has two differential amplifiers D1 and D1', whose noninverting inputs are each connected to the outputs of the modulator MOD2. The inverting inputs of the differential amplifiers D1, D1' are connected to each other via a first resistor R1. Feed back resistors R2, R2' in each case connect the differential amplifier output to the inverting input of the differential amplifiers D1, D1'. The error signal demodulator FD2 connected to the output of the operational amplifier OP2 again has a low-pass filter TP1 with transconductance amplifiers V2, V2' connected downstream, whose outputs are each connected to the inverting inputs of the differential amplifiers D1, D1'. In an alternative embodiment, the transconductance amplifiers V2, V2' can be voltage amplifiers with a resistor on the output side or, instead of the two transconductance amplifiers V2, V2', one transconductance amplifier (OTA) with two inputs and two outputs (differential in, differential out) can be provided.

In FIG. 3, during the second clock phase (CLK2), the switches in the modulator MOD2 and demodulator DEM2 are switched in such a way that the measured signals carried in the differential path technique in each case have their polarity reversed. In addition, the excitation current supply and Hall voltage tap are rotated through 90° on the Hall sensor HS with respect to FIG. 2. In this case, the 90° rotation of the excitation current supply and of the Hall voltage tap are carried out in the opposite direction of rotation.

Figure 4:
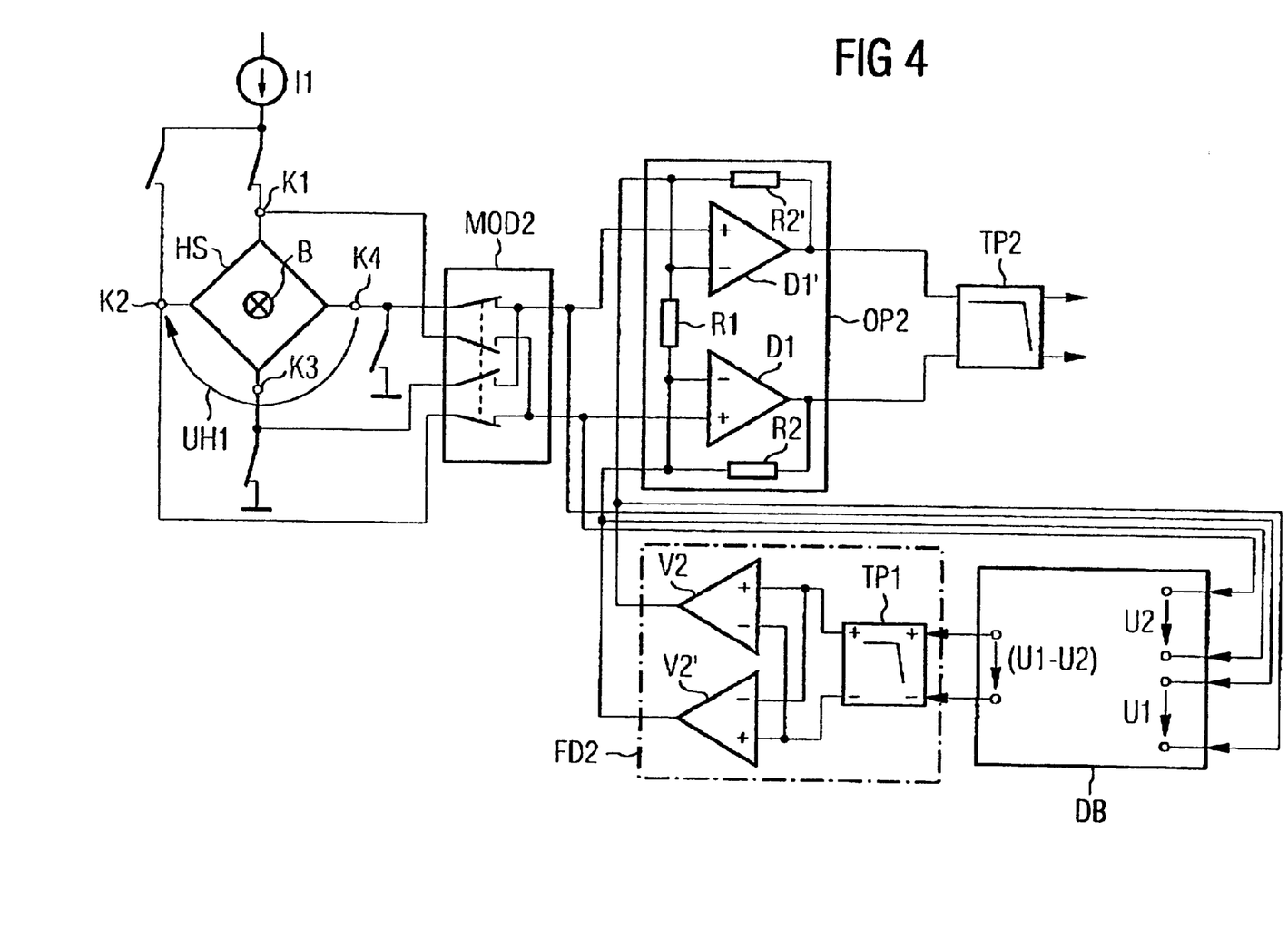
FIG. 4 is a block circuit diagram of an exemplary embodiment of the present invention with the error signals coupled out at the amplifier input.

FIG. 4 shows a further exemplary embodiment of the present invention, wherein the offset components and the error signals, respectively, are coupled out not downstream but upstream of the operational amplifier OP2. In contrast with the exemplary embodiment according to FIG. 2, in this case the error signal demodulator FD2 has a difference-forming module DB connected upstream, which forms the difference of the measured signal differential voltage U1 and the differential voltage across the resistor R1 in the operational amplifier OP2. The useful signal is present as a DC signal.

The circuit configuration according to FIG. 4 is shown during the first clock phase. The second clock phase can be derived in a simple way by analogy with FIG. 3. In this case, the excitation current supply and Hall voltage tap are rotated in the same direction. In order to change over the excitation current supply and Hall voltage tap, four switches are provided, which are connected to the nodes K1 to K4.

The difference former DB in each case forms the difference between the differential voltages U1, U2 both in the first and in the second clock phase. The first low-pass filter TP1 connected downstream sums or integrates the difference U1−U2 between the differential voltages U1, U2 in each case in the first and the second clock phase.

In the circuit according to FIG. 4, the demodulator DEM2 can be omitted. The differential amplifiers D1, D1' according to FIG. 4 are designed as operational amplifiers, while the amplifiers V2, V2' of the error signal demodulator FD2 are designed as transconductance amplifiers. In an alternative embodiment, instead of the transconductance amplifiers, voltage amplifiers with a resistance on the output side can be provided.

The chopping clock which can be supplied to the modulator MOD2 can additionally be supplied to the first low-pass filter TP1.

Figure 5:
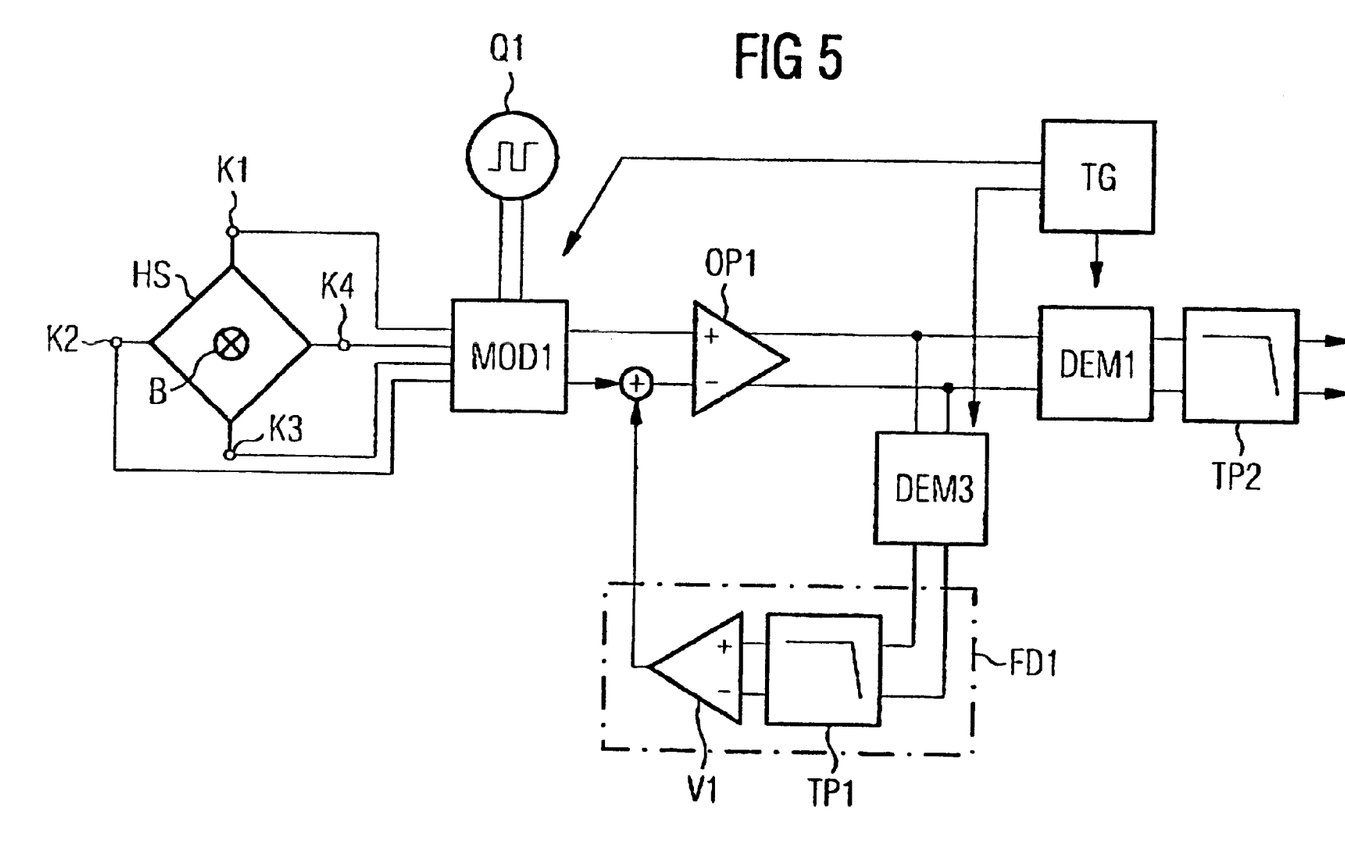
FIG. 5 is a block circuit diagram of an exemplary embodiment of the invention with an additional demodulator in the error signal branch.

FIG. 5 shows a development of the exemplary embodiment according to FIG. 1. In this case, an additional demodulator DEM3 is arranged between the output of the amplifier OP1 and the first low-pass filter TP1. In order to supply a clock signal, the additional demodulator DEM3 is connected to the clock generator TG, which also drives the modulator MOD1 and the demodulator DEM1 arranged in the useful signal path. The additional demodulator DEM3 in this case forms the sum or the average in the correct phase over two successive clock phases.

In an alternative embodiment to FIG. 5, the feedback supply of the signals that can be tapped off on the output side of the error signal demodulator can be provided on the input side of the Hall element. For this purpose, additional switches driven in correct phase by the clock generator can be provided. Instead of the first low-pass filter TP1, averagers, summers or an integrator can be provided.

Figure 6:
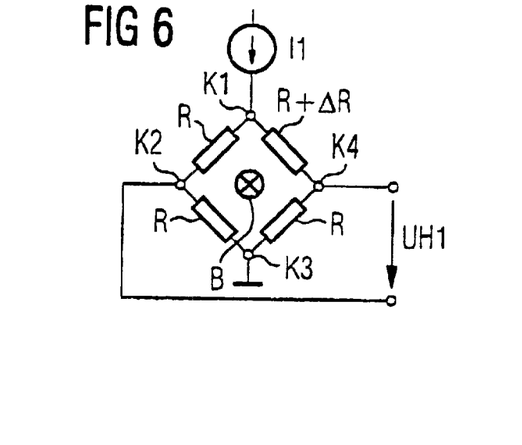
FIG. 6 is an equivalent circuit of the Hall sensor in FIG. 2.

FIG. 6 shows an equivalent circuit of the Hall sensor HS from FIG. 2 during the first clock phase. According to the equivalent circuit of FIG. 6, in each case resistors R are arranged between the four terminals K1 to K4 of the Hall sensor, of which the resistor between K1 and K4 has a deviation ΔR from the remaining resistance values between the adjacent terminals K1 to K4. The deviation ΔR from the resistance value R of the resistor between the first and fourth terminals K1, K4 represents the cause for the direction-dependent offset voltage of the Hall element. The excitation current I1 is impressed into the Hall element HS via a first pair of terminals K1, K3. The first measured signal UH1 can be tapped off via the second pair of terminals K2, K4 when the Hall element is penetrated by a magnetic field B.

Figure 7:
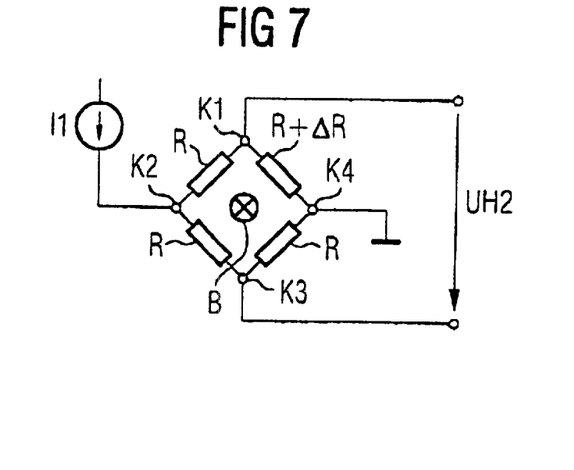
FIG. 7 is an equivalent circuit of the Hall sensor in FIG. 3.

FIG. 7 shows the equivalent circuit according to FIG. 6 during the second clock phase and is accordingly an equivalent circuit for the Hall sensor HS according to FIG. 3. In this case, the connections for excitation current and second measured signal are rotated through 90° as compared with FIG. 6. Accordingly, the second measured signal UH2 can be tapped off via the first pair of terminals K1, K3 when the excitation current I1 is supplied via the second pair of terminals K2, K4 of the Hall element penetrated by a magnetic field B.

According to the equivalent circuits of FIGS. 6 and 7, the first and the second measured signal differ in that the first measured signal UH1 is formed from the sum of useful component and offset component, while the second measured signal UH2, present during the second clock phase, is formed from the difference between useful component and offset component.

Figure 8:
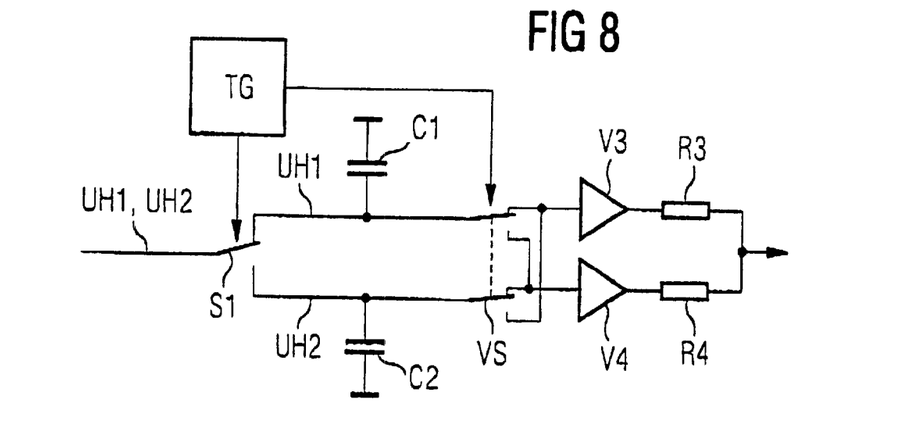
FIG. 8 is a circuit diagram of an exemplary embodiment of the additional demodulator shown in FIG. 5.

FIG. 8 shows a block circuit diagram wherein a pole reversal switch is provided. The circuit according to FIG. 8 can replace the demodulator DEM3 in FIG. 5. Here, it should be noted that the circuit according to FIG. 8 is implemented using the single-ended technique. However, the principle described can also be implemented in the differential path technique.

In the circuit according to FIG. 8, the amplifier (not shown here) for amplifying-the measured signals has a first switch S1 connected downstream which, during the first cycle phase, connects the first measured signal UH1 to a first capacitor C1 and, during the second cycle phase, connects the second, negative measured signal UH2 to a second capacitor C2. To this end, the first switch S1 is connected to a clock generator TG for supplying a chopping clock. The first and second capacitors C1, C2 are in each case connected to ground. Furthermore, a pole reversal switch VS for changing the polarity of the lines for the first and second measured signals UH1, UH2, and also amplifiers V3, V4 and resistors R3, R4, whose connections on the output side are connected to each other, are connected downstream of the first and second capacitors C1, C2. The pole reversal switch VS is driven by the chopping clock, just like the first switch S1. The circuit according to FIG. 5 has the advantage that unavoidable, fabrication-induced deviations of the resistance values of the resistors R3, R4 from each other can be compensated for by the above-described, correct-phase reversal of polarity of the lines carrying the first and second measured signals UH1, UH2, respectively. Formed at the output, therefore, is the average of the offset signal, from which the alternating voltage useful signal has been removed.

The principle described is designated the dynamic element interchange and avoids offsets caused by mismatches. In the demodulator configuration according to FIG. 8, the demodulator is used for error modulation by feeding back an error signal, but not for demodulation in the signal branch itself. Filters which are offset-free and consequently do not cause any additional errors caused by changes in the useful signal can be arranged in the signal branch.

The invention can also be applied in what is known as the spinning Hall principle, wherein it is not just two pairs of terminals and accordingly two clock phases which are provided, but wherein the Hall element has N pairs of terminals and accordingly N clock phases.

Even in a Hall element having only two pairs of terminals, four clock phases can be formed by the excitation current being fed into the Hall element in 90° steps and by it being possible to tap off the measured signal in each case orthogonally with respect to the excitation current.

I claim:
1. An amplifier circuit with offset compensation, comprising:
   a signal source for outputting a first measured signal in a first clock phase and a second measured signal in a second clock phase, each of the first and second measured signals having a useful component and, possibly, an offset component;
   an amplifier having an input side connected to said signal source for receiving the measured signals and having an output side for carrying amplified measured signals;
   an error signal demodulator connected to one of said input side and said output side of said amplifier for receiving the measured signals; and
   said error signal demodulator having an output connected to an input at said input side of said amplifier for supplying the offset component in antiphase.
2. The amplifier circuit according to claim 1, wherein said signal source is a magnetic field sensor.
3. The amplifier circuit according to claim 1, wherein the measured signals are carried in differential path technique.
4. The amplifier circuit according to claim 3, which comprises a modulator capable of reversing a polarity of the measured signal lines connected between said magnetic field sensor and said amplifier, and a demodulator connected at said output side of said amplifier adapted to reverse the polarity of the measured signal lines.
5. The amplifier circuit according to claim 4, wherein said error signal demodulator includes a low-pass filter and at least one amplifier connected to an output of said low-pass filter.
6. The amplifier circuit according to claim 1, wherein said error signal demodulator includes a first low-pass filter, and a second low-pass filter is connected to the output side of said amplifier.
7. The amplifier circuit according to claim 6, wherein said second low-pass filter is an analog RC element.
8. The amplifier circuit according to claim 7, wherein said second low-pass filter is provided in said demodulator, and said demodulator comprises means for reversing polarity and resistors connected downstream of said means for reversing polarity.
9. The amplifier circuit according to claim 4, wherein said second low-pass filter is provided in said demodulator, and said demodulator comprises means for reversing polarity and resistors connected downstream of said means for reversing polarity.
10. The amplifier circuit according to claim 2, wherein the magnetic field sensor has a Hall element.
11. The amplifier circuit according to claim 10, wherein said Hall element has two mutually orthogonal pairs of terminals, said pairs of terminals including a first pair of terminals receiving an excitation current in the first clock phase and a second pair of terminals carrying the first measured signal in the first clock phase, and wherein said second pair of terminals receives the excitation current in the second clock phase and said first pair of terminals carries the second measured signal in the second clock phase.

* * * * *